(12) United States Patent
Akurati et al.

(10) Patent No.: US 8,541,317 B2
(45) Date of Patent: Sep. 24, 2013

(54) DEPOSITION METHOD FOR PASSIVATION OF SILICON WAFERS

(75) Inventors: Kranthi Akurati, Staufen (CH); Magnus Kunow, Zurich (CH); Andreas Zimmermann, Niederlenz (CH); Ron Jervis, Rogue River, OR (US)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 12/979,761

(22) Filed: Dec. 28, 2010

(65) Prior Publication Data

US 2011/0189861 A1  Aug. 4, 2011

Related U.S. Application Data

(63) Continuation of application No. PCT/EP2009/058387, filed on Jul. 3, 2009.

(30) Foreign Application Priority Data

Jul. 4, 2008 (EP) .................................... 08159693

(51) Int. Cl.
*H01L 21/31* (2006.01)
*H01L 21/469* (2006.01)
*H01L 29/06* (2006.01)
*H01L 23/544* (2006.01)

(52) U.S. Cl.
USPC ........... 438/778; 438/758; 438/788; 438/710; 257/618; 257/620; 257/623

(58) Field of Classification Search
USPC ................. 438/778, 758, 788, 710, 771, 776, 438/792, 798; 257/618–626
See application file for complete search history.

(56) References Cited

U.S. PATENT DOCUMENTS

| | | | | |
|---|---|---|---|---|
| 5,384,008 A * | 1/1995 | Sinha et al. | .................. | 438/694 |
| 6,023,405 A | 2/2000 | Shamouilian et al. | | |
| 6,557,248 B1 | 5/2003 | Shamouilian et al. | | |
| 2004/0112294 A1* | 6/2004 | Allen et al. | .................. | 118/728 |
| 2005/0284371 A1 | 12/2005 | McFadden et al. | | |
| 2007/0243652 A1 | 10/2007 | Bour et al. | | |

FOREIGN PATENT DOCUMENTS

| | | |
|---|---|---|
| CN | 1572014 A | 1/2005 |
| CN | 19611097 A | 5/2007 |
| WO | WO 03/034473 A2 | 4/2003 |
| WO | WO 2006/012048 A2 | 2/2006 |

OTHER PUBLICATIONS

International Search Report (PCT/ISA/210) issued on Aug. 18, 2009, by European Patent Office as the International Searching Authority for International Application No. PCT/EP2009/058387.

Written Opinion (PCT/ISA/237) issued on Aug. 18, 2009, by European Patent Office as the International Searching Authority for International Application No. PCT/EP2009/058387.

(Continued)

*Primary Examiner* — Chuong A. Luu

(74) *Attorney, Agent, or Firm* — Buchanan Ingersoll & Rooney PC

(57) ABSTRACT

A substrate is mounted onto an elevated substrate support of a substrate carrier plate. The substrate carrier plate with the substrate is then placed in a plasma reactor. Due to the elevated substrate support, both opposite sides of the substrate are exposed to the plasma and are therefore coated with an electrical passivation layer.

19 Claims, 3 Drawing Sheets

(56) References Cited

OTHER PUBLICATIONS

European Search Report dated Nov. 4, 2008 for European Application No. 08159693.4.
Wolf S. et al., Silicon Processing for the VLSI Era, vol. 1: Process technology, 1986, Lattice Press, Sunset Beach, California, USA, XP002500748, p. 171-174.
Widman D. et al., Technologie hochintegrierter Schaltungen, 2, Auflage, 1996, Springer-Verlage, XP002500749, p. 13-21.
J. Robertson, Diamond-like amorphous carbon, Materials Science and Engineering R, 37, 2002, p. 129-281.
Office Action issued on Apr. 18, 2012 in corresponding Chinese Application No. 200980125662.9.

* cited by examiner

PRIOR ART

DEPOSITION METHOD FOR PASSIVATION OF SILICON WAFERS

RELATED APPLICATIONS

This application claims priority as a continuation application under 35 U.S.C. §120 to PCT/EP2009/058387, which was filed as an International Application on Jul. 3, 2009 designating the U.S., and which claims priority to European Application 08159693.4 filed in Europe on Jul. 4, 2008. The entire contents of these applications are hereby incorporated by reference in their entireties.

FIELD

The present disclosure relates generally to the field of high-voltage, high-power semiconductors. More particularly, the present disclosure relates to a method and an apparatus for a single-step double-sided deposition of an electrical passivation layer on semiconductor wafers for power semiconductors.

BACKGROUND INFORMATION

In general, bipolar power semiconductors, such as diodes, thyristors, gate turn-off thyristors (GTOs) and gate controlled thyristors (GCTs), are made from silicon wafers. After these silicon wafers have undergone different implantation, diffusion, photolithographic and metallization processes, they are cut to circular discs, and a negative or positive bevel is ground on the high-voltage blocking pn-junction(s). These bevels usually need to be protected with an electric passivation layer. One of the known passivation materials is amorphous hydrogenated carbon (a-C:H, also known as Diamond-like carbon DLC) which can be deposited in a Plasma Enhanced Chemical Vapor Deposition (PECVD) process inside a parallel plate plasma reactor, but could generally be deposited in PECVD reactors of other geometries or by ion beam, sputtering, cathodic arc, pulsed laser deposition or low pressure CVD.

A simplified representation of the general PECVD process is given in FIG. 1. The silicon wafer (substrate) 4 is in contact with the second, lower electrode 2 inside the reaction chamber 8 via a substrate carrier plate 3. A hydrocarbon precursor gas (e.g., methane, acetylene) enters the reaction chamber 8 of the plasma reactor through openings 11 in the first, upper electrode 1, is ionized by radiofrequency, and forms the bulk plasma 6. The edge plasma layer 7 is the space where the plasma ions get accelerated into the direction of the substrate and substrate carrier plate 3 due to a DC bias voltage applied between the two electrodes 1, 2.

The common process is to put the silicon wafers 4 inside a recess 33 on an aluminum substrate carrier plate 3, as depicted in FIG. 1. This substrate carrier plate 3 not only acts as a holder for the silicon wafers (substrate) 4, but it also establishes the disc's thermal and electrical contacts to the actively cooled second (lower) electrode 2 in the reaction chamber 8. The bevel on the silicon wafer facing the first (upper) electrode 1 is exposed to the a-C:H depositing plasma while the remaining upper surface of the silicon wafer 4 is covered by an aluminum shadow mask 5. Active cooling of the silicon wafer 4 during the depositing process is necessary to avoid passivation layers with unsatisfactory electrical properties. Thermal degradation of a-C:H is reported in "Diamond-like amorphous carbon", by J. Robertson, Materials Science and Engineering: R: Reports 37, (2002) 129.

Silicon wafers with two high voltage blocking pn-junctions (e.g., a thyristor) may have one negative bevel ground on each of its opposite sides. With the common process described above, only the upper bevel is coated with a-C:H in a single process run. As a result, manual flipping-over of the silicon wafer and a second a-C:H deposit-process run are required. Since the bevel coated in the second process step is put into the recess face-down during the first process step in an unprotected and very sensitive state, there is a risk of the bevel becoming contaminated, resulting in a reduced blocking yield.

SUMMARY

An exemplary embodiment provides a method for applying a double-sided deposition of amorphous hydrogenated carbon onto a silicon wafer. The wafer includes a first main side having a first bevel on a border of the first main side, and a second main side having a central area and a second bevel on a border of the second main side surrounding the central area. The second main side is arranged opposite the first main side. The exemplary method includes mounting the wafer on a substrate support of a substrate carrier plate, such that the wafer is placed on the substrate support with only the central area of the second main side being in contact with the substrate support. The exemplary method also includes placing the substrate carrier plate with the wafer in a reaction chamber of a plasma reactor. In addition, the exemplary method includes simultaneously exposing the first and second bevels to a plasma in order to create the deposition, wherein amorphous hydrogenated carbon is applied as the plasma.

An exemplary embodiment provides a substrate carrier plate for carrying a silicon wafer for the manufacturing of a semiconductor device during a deposition process for depositing a double-sided deposition on the surface of the wafer in a plasma reactor chamber. The wafer includes a first main side having a first bevel on a border of the first main side, and a second main side having a central area and a second bevel on a border of the second main side surrounding the central area. The second main side is arranged opposite the first main side. The exemplary substrate carrier plate includes a substrate support for carrying the wafer. The substrate support is formed such that when the wafer is placed on the substrate support, only the central area of the second main side comes in contact with the substrate support.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
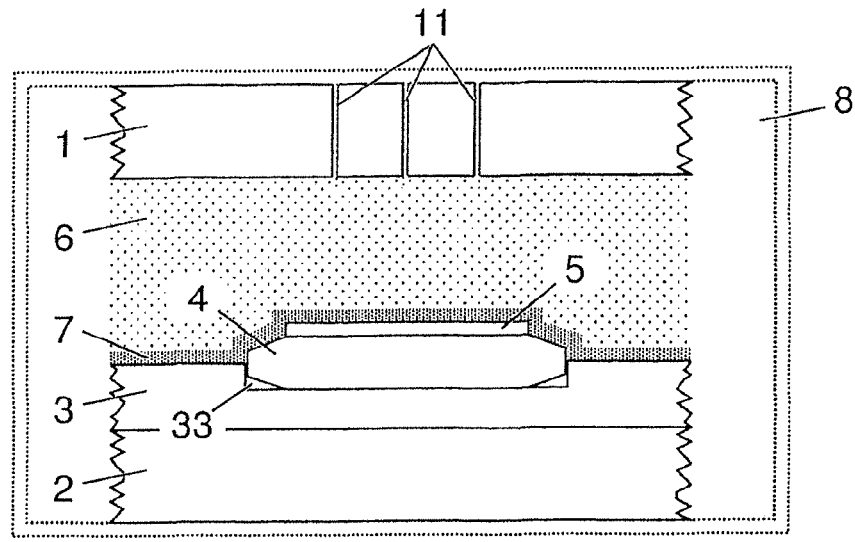
FIG. 1 schematically shows an assembly with a silicon wafer within a parallel plate reactor in a known single sided deposition process.

Exemplary embodiments of the present disclosure provide a single-step method for the deposition of an double-sided deposition as an electrical passivation layer, such as a homogeneous a-C:H layer, on two sides of a wafer. Exemplary embodiments of the present disclosure also provide an improvement to an existing deposition apparatus to allow such a single-step process for the deposition of an electrical passivation layer on a semiconductor wafer.

Exemplary embodiments of the present disclosure are based on Plasma Enhanced Chemical Vapor Deposition (PECVP) in combination with an improved substrate-holder apparatus. For instance, the exemplary method includes the step of mounting a silicon wafer on an elevated substrate support of a substrate carrier plate and placing the substrate carrier plate with the silicon wafer in a plasma reactor. The substrate support is formed such that the wafer is placed on the substrate support with only its central area of the second main side being in contact to the substrate support. Due to such an elevated substrate support, both opposite sides of the silicon wafer are exposed to the plasma and are therefore coated with an electrical passivation layer. By the electrical passivation layer, the wafer is electrically inactivated in the area of the electrical passivation layer (the passivation layer is not completely electrically inactive while it is partially conductive).

According to an exemplary embodiment, a-C:H-layers are deposited on two sides of the wafer, e.g. a silicon wafer, in one process step, either both on the two sides of one silicon wafer or on two silicon wafers stacked back to back. According to an exemplary embodiment, the wafer includes a first main side having a first bevel on the border of the first main side, and a second main side having a central area and a second bevel on the border of the second main side surrounding the central area. The second main side is arranged opposite the first main side. The wafer is mounted on a substrate support of a substrate carrier plate. The substrate support is formed such that the wafer is placed on the substrate support with only its central area of the second main side being in contact to the substrate support. Then the substrate carrier plate is placed with the wafer in a reaction chamber of a plasma reactor. Accordingly, the first and second bevels are exposed simultaneously to the plasma in order to create the electrical passivation layer. In an exemplary embodiment, amorphous hydrogenated carbon is applied as the plasma to form the electrical passivation layer onto the wafer.

In order to avoid deteriorated heat transfer which may occur due to the increased distance between the silicon wafer carried on the elevated substrate support of the substrate carrier plate and the actively cooled lower electrode, an exemplary embodiment of the present disclosure also provides a substrate carrier plate design and an improved silicon wafer cooling mechanism. This allows for reasonable heat dissipation, which is crucial for the deposition process, since more graphite-like carbon layers with unsatisfactory electrical properties may be deposited at substrate temperatures above approximately 200° C., for example.

The disclosed exemplary embodiments highlight improvements from using a pedestal-like substrate carrier plate instead of a recess. Therefore, both sides of a silicon wafer are exposed to the plasma. Nevertheless, homogeneous deposition is highly non-trivial, especially for the bevel adjacent to the lower electrode. As both even plasma flux-rates and homogeneous electric fields are necessary for the deposition of uniform a-C:H-layers, mushroom-shaped (e.g. concave, upside down truncated cone, etc.) designs of the elevated substrate supports tend to be advantageous over purely cylindrical designs.

In accordance with an exemplary embodiment, adjusted deposit-process parameters of the DC bias voltage are also provided.

FIG. 1 provides a schematic drawing of a parallel plate reactor used in a known PECVD-process with a pair of parallel plate electrodes 1 and 2, a reaction chamber 8, bulk plasma 6, edge plasma layer 7, silicon wafer 4, shadow mask 5, and substrate carrier plate 3 with recess 33. Electron energy (plasma) is used as the activation method to enable a-C:H deposition on the silicon wafer 4. The hydrocarbon precursor gas (e.g., methane, acetylene) enters the reaction chamber 8 through openings 11 in the upper electrode 1. It is ionized by radiofrequency and forms the bulk plasma 6. The edge plasma layer 7 is the space in the reaction chamber 8 where plasma ions get accelerated to the silicon wafer 4 or substrate carrier plate 3 due to a DC bias voltage that has been applied between the two electrodes 1 and 2. The silicon wafer 4, as a substrate, is put inside a recess 33 on the substrate carrier plate 3. This substrate carrier plate 3 not only acts as a mechanical substrate holder, but it also establishes thermal and electrical contacts between the silicon wafer 4 and the lower electrode 2 in the reaction chamber 8 of the plasma reactor. One bevel on the silicon wafer that is to be passivated faces the upper electrode 1. This bevel is exposed to the a-C:H depositing plasma 6 and/or 7. Areas on the top surface of the silicon wafer that are not subject to passivation are covered by a shadow mask 5. In the known process, only the upper bevel is coated with a-C:H in a single process run. As a result, manual flipping-over of the silicon wafer and a second a-C:H deposit-process run are required for a silicon wafer with two high voltage blocking pn-junctions, that have one bevel on each opposite side (e.g., a thyristor). As mentioned above, the bevel coated in the second process step is put into the recess 33 face-down (in an unprotected and therefore very sensitive state) during the first process step and is therefore at a high risk of being contaminated, resulting in a reduced blocking yield.

Figure 2:
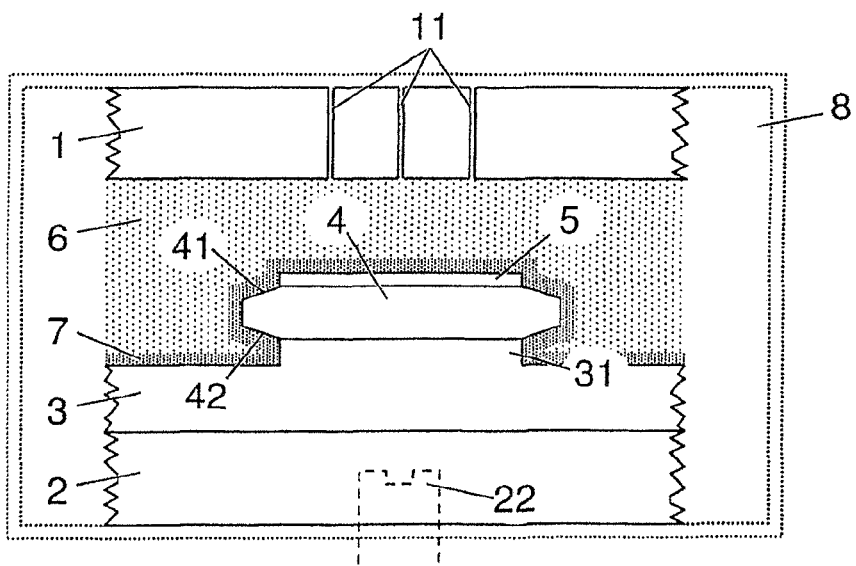
FIG. 2 schematically shows an assembly with a silicon wafer on an elevated substrate support within a parallel plate reactor, according to an exemplary embodiment of the present disclosure.

FIG. 2 provides a schematic drawing of a parallel plate reactor used in a one-step double-sided PECVD-process, according to an exemplary embodiment of the present disclosure. The exemplary apparatus illustrated in FIG. 2 differs from the one used in FIG. 1 in that a newly developed substrate carrier plate 3 is used. The substrate carrier plate 3 illustrated in FIG. 2 can be made of electrically and thermally conducting material, such as aluminum or another metal, for example. The silicon wafer (substrate) 4 is no longer placed inside a recess in the substrate carrier plate 3, in order to overcome the limitation of only single-sided a-C:H-deposition. Instead, the silicon wafer 4 is placed on top of a "mushroom-like" or "pedestal-like" protrusion, which is referred to herein as an elevated substrate support 31. The wafer is placed on the substrate carrier plate 3 with a contact area such that the second main side of the wafer is in contact with the substrate carrier plate 31 and the first and second bevels are not covered or enclosed or encased by the substrate carrier plate 31.

The elevated substrate support 31 is arranged on top of the substrate carrier plate 3, either integrated in the substrate carrier plate 3 or as a separate part. The substrate carrier plate 3 not only acts as a mechanical substrate holder for the silicon wafer 4, but it also establishes thermal and electrical contacts between the silicon wafer 4 and the lower electrode 2 in the reaction chamber 8. By lifting the position of the silicon wafer 4, flow of plasma, which again is created from precursor gases flowing into the reaction chamber 8 through openings 11 of the parallel plate electrode 1, is no longer limited to the upper bevels 41 of the silicon wafer substrate. Instead, the a-C:H-deposition simultaneously occurs on the upper bevels 41 and lover bevels 42 of the silicon wafer 4. The non-coatable upper surface areas of the silicon wafer are again covered by a shadow mask 5. To indirectly limit the temperature of the silicon wafer 4 to a level below approximately 200° C., the bottom electrode 2 can be actively cooled, e.g. by a liquid (e.g., water) cooling device 22 running at a temperature of about 15 to 20° C.

Figure 3:
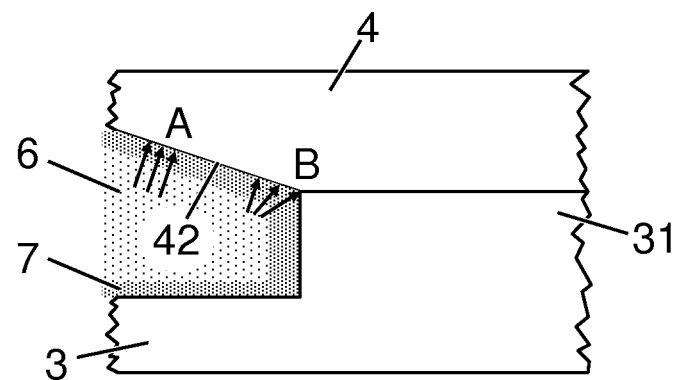
FIG. 3 shows in more detail the assembly of FIG. 2, according to an exemplary embodiment of the elevated substrate support.

FIG. 3 provides a more detailed view of an exemplary "pedestal-like" elevated substrate support 31 of the substrate carrier plate 3 with the wafer, e.g. a silicon wafer 4, on top. Ions from the bulk plasma 6 get accelerated to the silicon wafer 4 in the edge plasma layer 7 near the surfaces that are electrically connected to the bottom electrode 2. Homogeneous a-C:H deposition on the silicon wafer 4 at different regions A and B is highly non-trivial especially for the lower bevel on the silicon wafer. The reason is that evenly distributed plasma flux-rates and homogeneous electric fields are necessary for the deposition of uniform a-C:H-layers. However, except for extremely small plasma edge layer thicknesses, the plasma-flux density as well as the accelerating electric field can differ for regions A and B resulting in slightly in homogeneous a-C:H deposition in these regions. To a certain extent, such inhomogenities can be compensated for by a slight tuning of the process parameters, as the plasma edge layer thickness scales with the square root of the DC bias voltage, which can be decreased to a minimum of approximately 500 Volts. This minimal DC bias voltage may vary for some reactors, as it is dependant of many different parameters.

Figure 4:
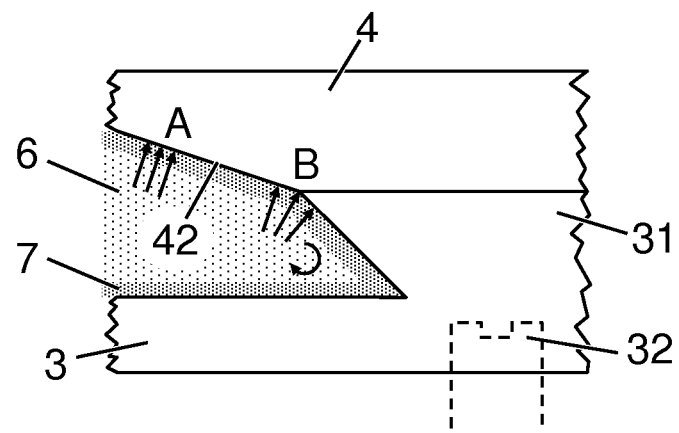
FIG. 4 shows in more detail the assembly of FIG. 2, according to an exemplary embodiment of the elevated substrate support.

FIG. 4 provides a more detailed view of an exemplary embodiment of the substrate carrier plate 3, including the elevated substrate support 31, according to an embodiment of the present disclosure. Instead of using a mere cylindrical protrusion as the elevated substrate support 31 of the substrate carrier plate 3, an additional rotated cut at the base leads to a concave cross-section of the elevated substrate support 31. Regarding this type of geometrical profile, these elevated substrate supports 31 are herein referred to as "mushroom-shaped". Possible geometrical cut, mushroom shaped, profiles are not limited to straight lines. Any geometrical profile of the elevated substrate support 31 can be used, e.g. concave, upside down truncated cone, etc., provided that plasma flux-rates are sufficiently high and electric/magnetic fields on the bottom bevels of the silicon wafer 4 provide a deposition rate as homogeneous as possible. In these cases, homogeneous a-C:H deposition on the silicon wafer 4 at different regions A and B is facilitated. Remaining possible inhomogenities can again be compensated for by a slight tuning of the process parameters, as the plasma edge layer thickness scales with the square root of the DC bias voltage, which can be decreased to a minimum of approximately 500 V. Improved and more direct cooling of the silicon wafer can be achieved by active cooling with a cooling device 32 arranged in or adjacent to the substrate carrier plate 3 or in or adjacent to the elevated substrate support 31 of the substrate carrier plate. As the cooling device 32, water and/or liquid cooling can be used, operating, for example, at a temperature of 15 to 20° C. This optimized in-situ cooling strategy in combination with an optional pre-cooling procedure of the silicon wafer and/or the substrate carrier plate 3 leads to a maximal process temperature of the silicon wafer of below 200° C. In order to further reduce the temperature of the silicon wafer during the deposition process, cooling means (e.g., water and/or liquid cooling device) can be arranged in the shadow mask 5, which is covering an upper surface of the silicon wafer 4. As mentioned above, satisfactory heat dissipation is important for the deposition process as silicon wafer temperatures above 200° C. may lead to the deposition of graphite-like carbon layers with unsatisfactory electrical properties.

In order to properly align, e.g., concentrically align, the silicon wafer 4 and the elevated substrate support 31 of the substrate carrier plate 3, an aligning or centering device can be used prior to loading the assembly into the reaction chamber of the plasma reactor 8.

Figure 5:
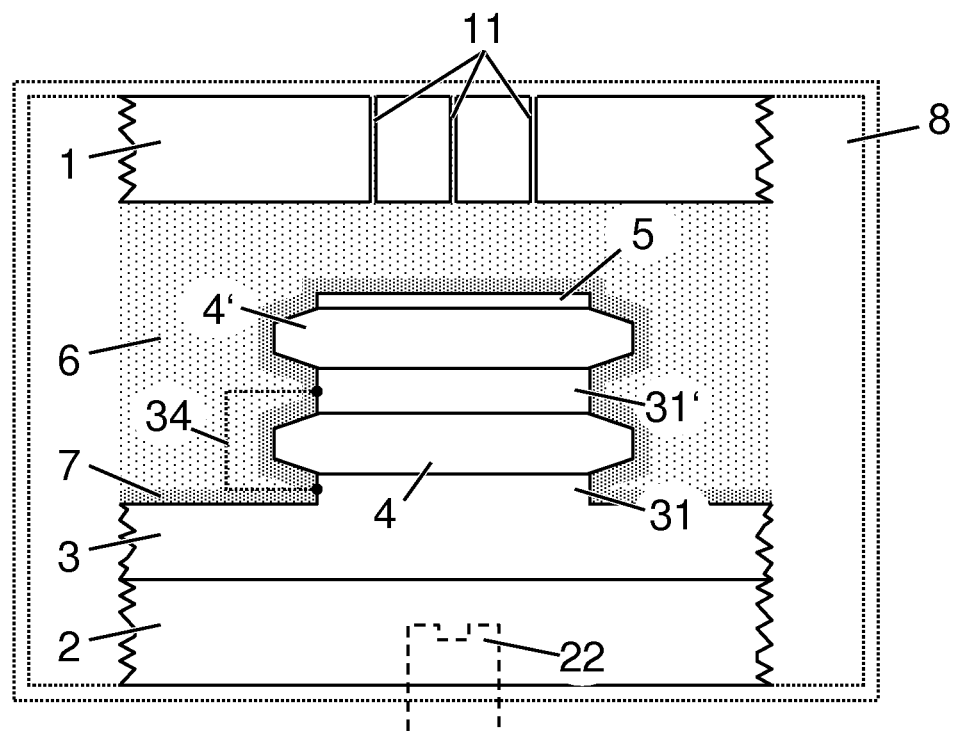
FIG. 5 schematically shows an assembly with stacked silicon wafers on elevated substrate supports within a parallel plate reactor, according to an exemplary embodiment of the present disclosure.

According to an exemplary embodiment, as schematically shown in FIG. 5, additional silicon wafers 4' may be stacked on top of the one silicon wafer 4 carried on the elevated substrate support 31. An elevated substrate support 31' can be arranged between adjacent silicon wafers 4 and 4' in the stack, in order to allow homogeneous a-C:H deposition on adjacent silicon wafers 4 and 4'. According to another exemplary embodiment, this additional elevated substrate support 31' may be omitted, to allow back-to-back stacking of two silicon wafers, each with only one high voltage blocking pn-junction, such as diodes, GTOs and GCTs, and therefore only one bevel to be passivated.

According to an exemplary embodiment, cooling means (e.g., water and/or liquid cooling device) may be arranged within the additional elevated substrate supports 31' and/or the shadow mask 5, arranged on top of the stack. According to an exemplary embodiment, an electrically conducting connection 34 can be arranged between the additional elevated substrate supports 31' and one or several or all of the parts, which are electrically connected to the lower electrode 2, e.g., the elevated substrate support 31, the substrate carrier plate 3 or the lower electrode 2 itself.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS 1, 2 Electrodes
22 cooler
3 substrate carrier plate
31, 31' Elevated Substrate support
32 cooler
33 recess
34 electrically conducting connection
4, 4' Si-disc/substrate
41 Upper bevel
42 Lower bevel
5 Shadow mask
6 bulk plasma
7 edge plasma layer
8 Reaction chamber of plasma reactor

What is claimed is:

1. A substrate carrier plate for carrying a silicon wafer for the manufacturing of a semiconductor device during a deposition process for depositing a double-sided deposition of an amorphous hydrogenated carbon layer on first and second bevels of the wafer in a plasma reactor chamber, wherein the wafer includes a first main side having the first bevel on a border of the first main side, and a second main side having a central area and the second bevel on a border of the second main side surrounding the central area, the second main side being arranged opposite the first main side, and wherein the substrate carrier plate comprises:

a substrate support for carrying the wafer, wherein the substrate support is formed such that when the wafer is placed on the substrate support, only the central area of the second main side comes in contact with the substrate support so that the amorphous hydrogenated carbon layer is deposited on both the first and second bevels of the wafer on the opposite first and second main sides of the wafer, respectively, when the central area of the second main side is in contact with the substrate support.

2. The substrate carrier plate as in claim 1, comprising a substrate support, wherein the substrate support has a surface area in a surface plane, on which the central area of the wafer is to be placed, and wherein the substrate carrier plate has a cross-section which diminishes with distance from the surface plane at least up to a first depth.

3. The substrate carrier plate as in claim 2, comprising several substrate supports each for carrying a wafer.

4. The substrate carrier plate as in claim 1, comprising several substrate supports each for carrying a respective wafer.

5. The substrate carrier plate as in claim 1, wherein said substrate support is a separate part which is attached to said substrate carrier plate.

6. The substrate carrier plate as in claim 5, wherein said substrate carrier plate comprises a substrate support configured to support a first wafer thereon, and to support at least one further wafer stacked on the first wafer.

7. The substrate carrier plate as in claim 1, wherein said substrate carrier plate comprises a substrate support configured to support a first wafer thereon, and to support at least one further wafer stacked on the first wafer.

8. The substrate carrier plate as in claim 7, comprising an additional substrate support arranged between each pair of adjacent wafers in the stack, the wafers from each pair of adjacent wafers being separated from each other by the additional substrate support, respectively.

9. The substrate carrier plate as in claim 8, comprising cooling means arranged in said additional substrate support.

10. The substrate carrier plate as in claim 8, comprising an electrically conducting connection arranged between said additional substrate support and at least one of (i) the substrate support, (ii) the substrate carrier plate, (iii) and an electrode of the substrate carrier plate.

11. A deposition apparatus for depositing a double-sided deposition of an amorphous hydrogenated carbon layer deposition on first and second bevels respectively arranged on opposing first and second surfaces of a silicon wafer, comprising:

a reaction chamber of a plasma reactor;

two parallel plate electrodes inside the reaction chamber of the plasma reactor;

a substrate carrier plate according to claim 7 having at least one wafer placed on the substrate support, wherein the substrate carrier plate is arranged on one of the electrodes.

12. A deposition apparatus for depositing a double-sided deposition of an amorphous hydrogenated carbon layer deposition on first and second bevels respectively arranged on opposing first and second surfaces of a silicon wafer, comprising:

a reaction chamber of a plasma reactor;

two parallel plate electrodes inside the reaction chamber of the plasma reactor;

a substrate carrier plate according to claim 5 having at least one wafer placed on the substrate support, wherein the substrate carrier plate is arranged on one of the electrodes.

13. The deposition apparatus as in claim 12, comprising cooling means for cooling the wafer during the deposition process.

14. The deposition apparatus as in claim 13, wherein said cooling means are arranged in at least one of (i) the substrate carrier plate, (ii) the substrate support of the substrate carrier plate, a (iii) a surface of a shadow mask covering the wafer, the surface of the shadow mask facing the other one of the two plate electrodes.

15. The deposition apparatus as in claim 13, wherein said cooling means are arranged in or adjacent to the one of the electrodes on which the substrate carrier plate is arranged.

16. The deposition apparatus as in claim 15, wherein said cooling means are arranged in at least one of (i) the substrate carrier plate, (ii) the substrate support of the substrate carrier plate, a (iii) a surface of a shadow mask covering the wafer, the surface of the shadow mask facing the other one of the two plate electrodes.

17. The substrate carrier plate as in claim 1, wherein the substrate support is cylindrical.

18. The substrate carrier plate as in claim 1, wherein said substrate carrier plate comprises cooling means arranged in said substrate support.

19. The substrate carrier plate as in claim 1, wherein said substrate support is elevated from said substrate carrier plate.

* * * * *